(12) United States Patent
Bourdelle et al.

(10) Patent No.: US 6,930,006 B2
(45) Date of Patent: Aug. 16, 2005

(54) ELECTRONIC CIRCUIT STRUCTURE WITH IMPROVED DIELECTRIC PROPERTIES

(75) Inventors: Konstantin K. Bourdelle, Orlando, FL (US); Yuanning Chen, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/144,511

(22) Filed: May 13, 2002

(65) Prior Publication Data

US 2002/0163050 A1 Nov. 7, 2002

Related U.S. Application Data

(62) Division of application No. 09/653,493, filed on Aug. 31, 2000, now abandoned.

(51) Int. Cl.[7] .............................................. H01L 21/00
(52) U.S. Cl. ..................................... 438/287; 438/785
(58) Field of Search ................................ 438/287, 785, 438/766, 763, 769, 770

(56) References Cited

U.S. PATENT DOCUMENTS

| | | | | |
|---|---|---|---|---|
| 4,557,036 A | * | 12/1985 | Kyuragi et al. ............. | 438/592 |
| 5,468,657 A | * | 11/1995 | Hsu ............................ | 438/766 |
| 5,510,295 A | * | 4/1996 | Cabral et al. ............... | 438/656 |
| 5,516,707 A | * | 5/1996 | Loh et al. ................... | 438/302 |
| 5,554,871 A | * | 9/1996 | Yamashita et al. .......... | 257/336 |
| 5,677,234 A | * | 10/1997 | Koo et al. .................. | 438/439 |
| 6,017,808 A | * | 1/2000 | Wang et al. ................ | 438/528 |
| 6,020,243 A | | 2/2000 | Wallace et al. ............. | 428/287 |
| 6,127,284 A | | 10/2000 | Gardner et al. ............. | 438/787 |
| 6,180,543 B1 | * | 1/2001 | Yu et al. ..................... | 438/787 |
| 6,245,689 B1 | * | 6/2001 | Hao et al. ................... | 438/769 |
| 6,252,296 B1 | * | 6/2001 | Umeda et al. .............. | 257/639 |
| 6,362,051 B1 | * | 3/2002 | Yang et al. ................. | 438/261 |
| 6,686,298 B1 | * | 2/2004 | Beaman et al. ............. | 438/775 |
| 2001/0041250 A1 | | 11/2001 | Werkhoven .................. | 257/49 |
| 2003/0036237 A1 | * | 2/2003 | Bryant ........................ | 438/303 |

FOREIGN PATENT DOCUMENTS

EP        540 993 A1    5/1993    .................... 29/62

OTHER PUBLICATIONS

Wolf et al., "Silicon Processing for the VLSI Era vol. 1: Process Technology", pp. 198–199, 1986, Lattice Press.*

* cited by examiner

*Primary Examiner*—Richard A. Booth
(74) *Attorney, Agent, or Firm*—Ferdinand M. Romano

(57) ABSTRACT

A semiconductor device having improved dielectric properties and a method for fabricating a semiconductor device. A semiconductor device includes a semiconductor layer suitable for device formation. A dielectric layer formed over the semiconductor layer has first and second opposing surfaces, a first surface region along the first surface and a second surface region along the second surface. A mid region is positioned between the first and second surface regions. The material of the dielectric layer includes a species having a concentration greater in the mid region than along the first opposing surface. The dielectric layer may be incorporated in a field effect transistor or a capacitor. According to a disclosed method an insulative layer is formed with two or more elements chemically bonded to one another. An additional species is introduced into the insulative layer in sufficient quantity to modify the net dielectric constant of the layer.

6 Claims, 4 Drawing Sheets

ELECTRONIC CIRCUIT STRUCTURE WITH IMPROVED DIELECTRIC PROPERTIES

This is a divisional of application Ser. No. 09/653,493 filed on Aug. 31, 2000 now abandoned.

FIELD OF THE INVENTION

The present invention relates generally to dielectric materials and, more specifically, to the formation of layers with high dielectric constants in electronic circuit structures and components, including semiconductor products.

BACKGROUND OF THE INVENTION

Dielectric materials are used in a wide variety of electronic circuit applications. In semiconductor applications these of materials often consist of silicon chemically combined with oxygen or nitrogen. Such dielectric materials are used as capacitor elements, gate insulators for field effect transistors and insulators in metallization systems. Silicon oxides are among the most common of dielectric materials used in semiconductor manufacture, but as device geometries continue to shrink the performance requirements of component materials is increasing beyond that which is attainable with silicon oxide. Accordingly, alternate dielectric materials are sought.

In certain applications, such as interlevel dielectrics for multilevel metallization systems, it is desirable for the insulator material to have a low dielectric constant relative to silicon dioxide. These insulators are generally referred to as low k dielectric materials. In contrast, to provide increased charge storage in capacitor elements, and lower switching voltages in Metal Oxide Semiconductor (MOS) Field Effect Transistors (FETs), it is desirable that insulator materials for these applications have high dielectric constants relative to silicon dioxide. Insulators in this class are generally referred to as high k dielectric materials.

Process integration and performance issues have severely limited the application of available high k materials in lieu of silicon oxides. This is particularly true for provision of FET gate insulators. That is, although insulators such as tantalum pentoxide and titanium dioxide have relatively high dielectric constants, these and other materials are not thermally stable when in direct contact with silicon.

Recently, evaluations have been performed on various high k silicate dielectrics to assess their performance and suitability for integration with semiconductor manufacturing processes. See, for example, Wilk, et al., "Electrical Properties of Hafnium Silicate Gate Dielectric Deposited Directly on Silicon," Applied Physics Letters, Vol. 74, No. 19, May 10, 1999. Problems with interface states and leakage currents have so far precluded application of these materials to gate and capacitor dielectrics in volume manufacture of semiconductor products. Generally, with continued increases in the density of semiconductor circuitry, there is a need for high k dielectric materials which provide satisfactory electrical and physical properties in order to provide higher performing gate and capacitor insulators in ultra large-scale integration (ULSI) applications.

SUMMARY OF THE INVENTION

The present invention provides a semiconductor device with an insulative layer having first and second opposing surfaces and comprising a species of varying concentration between the surfaces. In one embodiment, the device includes a transistor having a semiconductor layer, a gate conductor layer and a dielectric layer formed between the semiconductor layer and the gate conductor layer. The dielectric layer includes a mid portion positioned between and spaced apart from both the semiconductor layer and the gate layer. The dielectric layer includes a species having a peak concentration in the mid portion and a relatively low concentration between the mid portion and the semiconductor layer.

According to the invention, a method is provided for forming an electronic circuit wherein an insulative layer is formed of two or more elements chemically bonded to one another. In a preferred embodiment the electronic circuit is a semiconductor device and the layer comprises silicon dioxide. An additional species is introduced into the insulative layer in sufficient quantity to modify the net dielectric constant of the layer. The insulative layer includes first and second opposing surfaces, a first surface region along the first surface and a mid region between the first surface region and the second surface. In a preferred embodiment, the step of introducing the additional species is accomplished by introducing the species predominantly into a region other than the first surface region.

BRIEF DESCRIPTION OF THE DRAWINGS

The invention is best understood from the following detailed description when read in conjunction with the accompanying figures, wherein.

Like numbers denote like elements throughout the figures and text. The features described in the figures are not drawn to scale.

DETAILED DESCRIPTION

Figure 1:
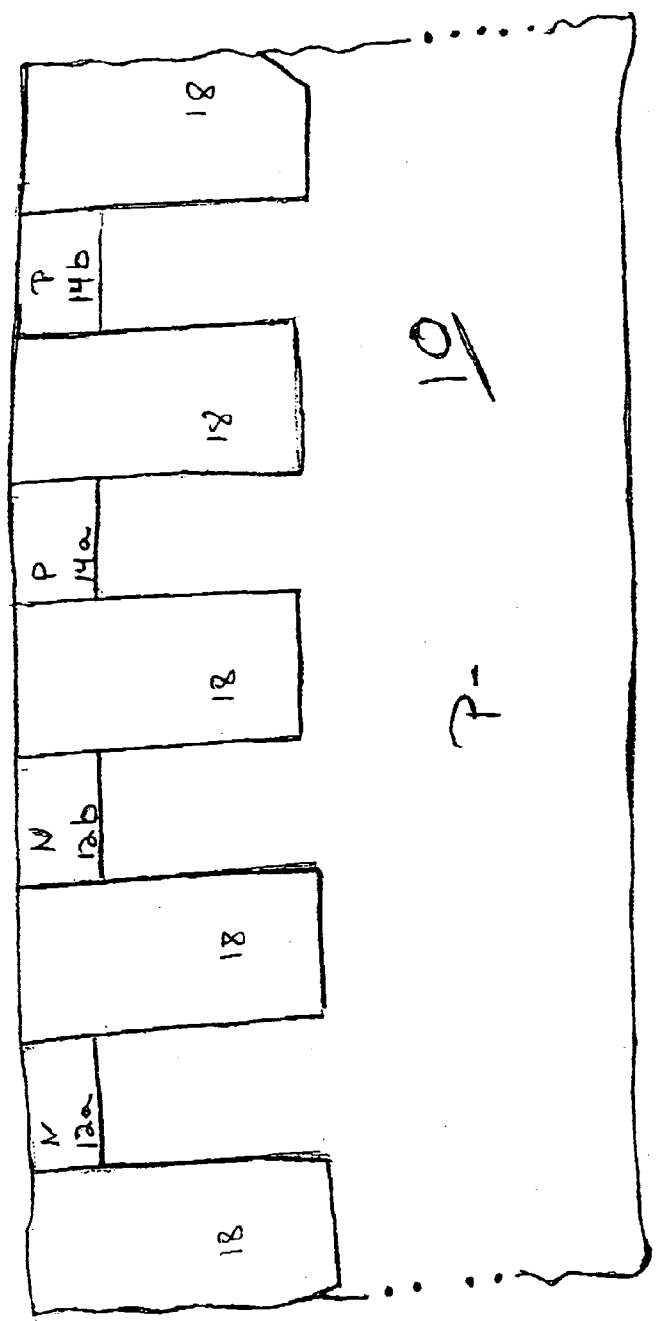
FIG. 1 illustrates in partial cross section a semiconductor structure during an early stage of device fabrication according to one embodiment of the invention.

With reference to FIG. 1 there is shown in partial cross-section a lightly doped layer 10 of crystalline silicon semiconductor material suitable for formation of transistor devices and other components according to a preferred embodiment of the invention. Along the upper surface of the layer 10 there are formed multiple N-well regions 12 and P-well regions 14 as is common for complementary MOS (CMOS) circuitry. The illustrated regions 12a, 12b, 14a and 14b are electrically separated from one another by shallow trench isolation regions 18 formed, for example, according to a conventional process sequence. MOS field effect transistors (MOSFETs) may be formed in all of the regions 12 and 14. For example, in digital circuitry the individual regions 12 and 14 may be formed in an alternating sequence to accommodate complementary MOS logic circuitry. In the illustrated embodiment pairs of N-well regions 12 are formed next to pairs of P-well regions 14 and MOSFETs are to be fabricated in the regions 12a and 14a.

Figure 2:
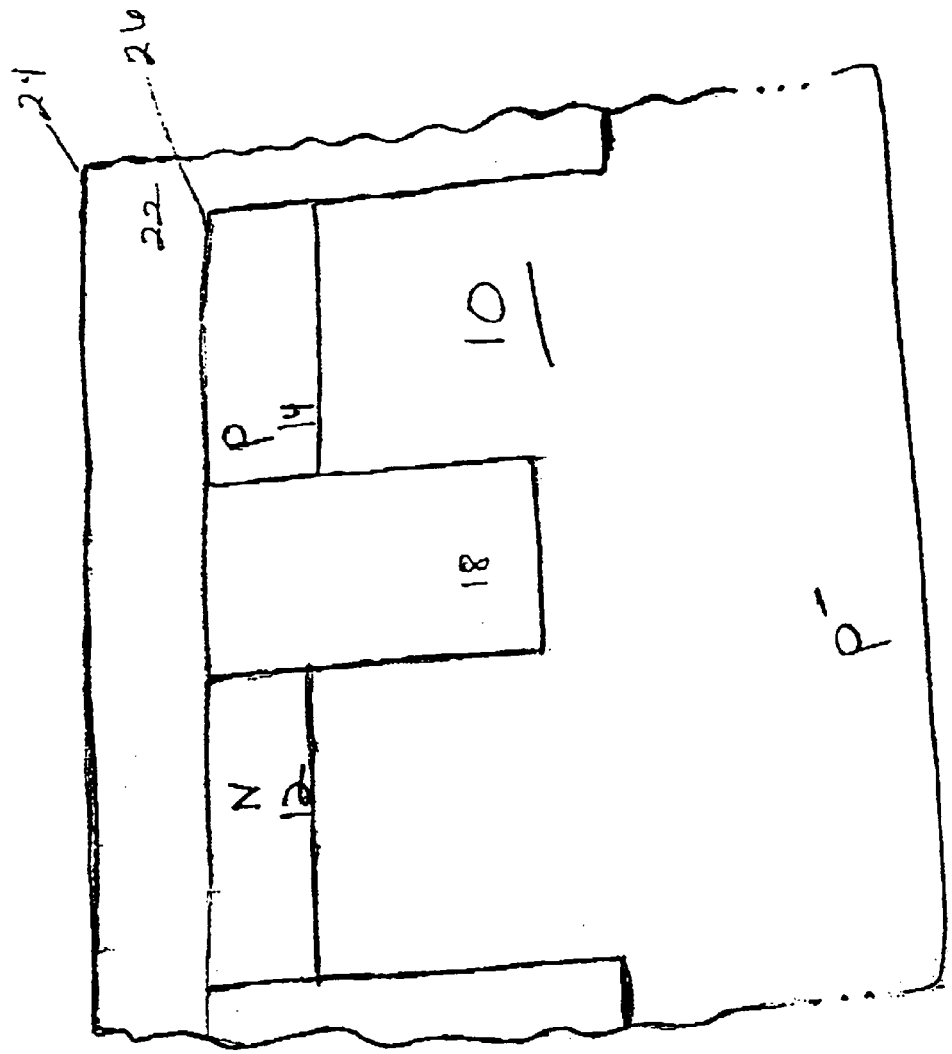
FIG. 2 illustrates the structure of FIG. 1 during subsequent processing according to the invention.

With the regions 12 and 14 formed, the upper surface of the layer 10 is stripped of any pad oxide and a high quality silicon oxide layer 22 is thermally grown into the surface of the layer 10 to a thickness of approximately 60 Å (6 nm). See FIG. 2 which illustrates, for an N-well region 12 and an adjacent P-well region 14, the oxide layer 22 having an upper surface 24 and an opposing lower surface 26 formed in the silicon layer 10. The interface of the oxide layer 22 and the crystalline semiconductor material of the layer 10 is referred to herein as an oxide-silicon interface, although it may be compositionally modified by subsequent processing. More generally, for embodiments wherein the layer 22 is not silicon dioxide or the layer 10 is not primarily silicon semiconductor, the corresponding region is referred to as the dielectric-semiconductor interface.

Figure 3:
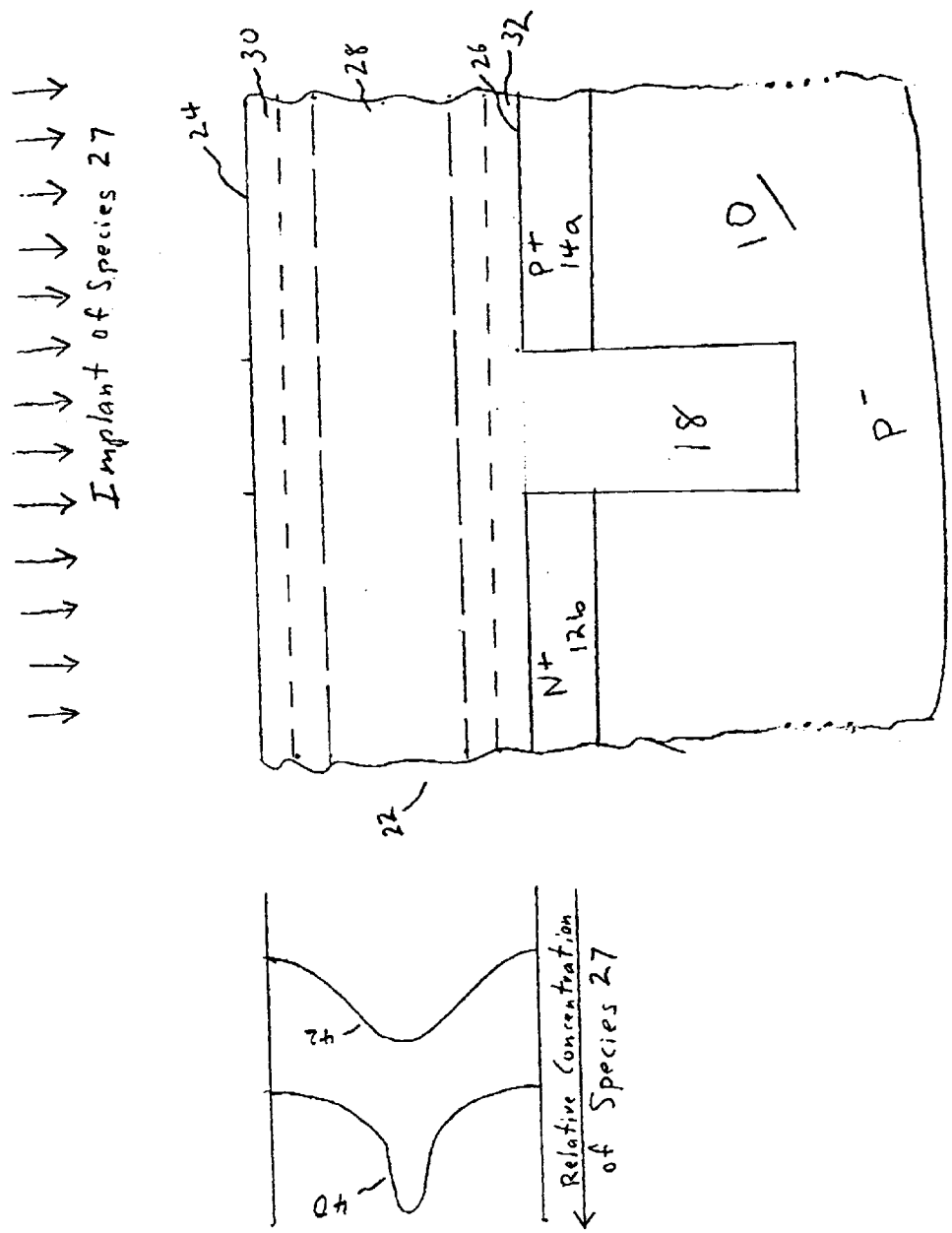
FIG. 3 illustrates details of the FIG. 2 structure after further processing to form a semiconductor device.

Next, with reference to FIG. 3, species 27 is introduced into the layer 22 by ion implantation or another well-known technique for adding a species into a solid layer in a controllable manner. Most preferably, the species comprises Hf or Zr. Generally, the species introduced will have a variable concentration between the upper surface 24 and the lower surface 26. For a dielectric layer 6nm in thickness, a high dose of Hf or Zr ions, e.g., $5 \times 10^{14}$ to $5 \times 10^{15}$ cm$^{-2}$, may be introduced with an implant energy of approximately 2 KeV or less. This combination of dose and low energy is preferred to minimize the concentration of the implanted species 27 along the surface 26. That is, the implanted dose should result in a relatively high concentration of Hf or Zr in a mid region 28 of the layer 22, a relatively low concentration of the species in an upper surface region 30 of the layer 22 along the upper surface 24, and a relatively low concentration of the species in a lower surface region 32 of the layer 22 along the lower surface 26. Initially, the implanted dose will have an Error function distribution centered about the layer 22 between the surfaces 24 and 26. This is illustrated in FIG. 3 by the curve 40, representing the relative concentration of the species 27 as a function of displacement between the upper surface 24 and the lower surface 26. A lower implant energy will place the peak of the distribution closer to the upper surface 24.

The implanted layer 22 is subjected to a rapid thermal anneal, e.g., 700 C. for 10 seconds, from which thermal diffusion alters the profile of the implanted species 27 to appear more like a Gaussian distribution. This is illustrated in FIG. 3 by the curve 42, representing the relative concentration of the species 27 as a function of displacement from the upper surface 24 to the lower surface 26. Diffusion of the species is of sufficient duration to alter the chemical composition throughout the mid region 28 of the layer 22, e.g., 3.5 to 4.5 nm, and possibly a portion of the surface region 30. Although the species may further diffuse into the surface regions 30 and 32, the combination of implant dose, implant energy and anneal time preferably does not allow any of the species to diffuse to the surface 26 of the layer 22. Although the illustrated distribution of the species 27 is centered between the upper surface 24 and the lower surface 26, the implant energy or diffusion time may be adjusted to displace the Gaussian distribution relative to the surfaces 24 and 26.

As a result of limited diffusion by the implanted species, the interface between the silicon dioxide layer 22 and the silicon layer 10 (i.e., at the surface 26) is minimally affected by the species 27. Thus, a high quality oxide-silicon interface can be sustained while a significant portion of the layer 22 comprises a sufficient concentration of the species 27 to increase the net dielectric constant of the layer 22.

The preferred embodiments limit diffusion of the species 27 because migration to the oxide-silicon interface may adversely affect device performance. More generally, other embodiments of the invention may include species which do not diffuse to the dielectric-semiconductor interface and do not adversely affect device performance. This may be true for integrated circuits formed on compound semiconductor materials or nonsilicon-containing semiconductor materials.

After the species 27 is introduced, e.g., by implantation or solid source diffusion, to raise the dielectric constant of the silicon oxide layer 22, a polysilicon gate conductor layer is deposited (e.g., by low pressure chemical vapor deposition) over the layer 22, followed by patterning, etching and siliciding to form gate structures 48 over the regions 12a and 14a. See FIG. 4 which illustrates a P-channel transistor 50 and an N-channel transistor 52, each incorporating a gate structure 48. Each gate structure includes a conventional conductor layer 56 formed from the polysilicon layer. The deposited polysilicon may include boron or phosphorous to later create, by solid source diffusion, P-type source/drain regions 58 in the P-well region 12a and N-type source/drain regions 60 in the N-well region 14a. Diffusion of the species 27 within the layer 22 may occur simultaneously with diffusion of dopant in the source/drain regions. However, it is preferred, in lieu of doping by out-diffusion, that the source/drain regions be defined by implantation of phosphorous and boron. The illustrated gate structures 48 also include low sheet resistance silicide layers 59, e.g., WSi, formed in the conductor layer 56, according to well-known techniques.

Figure 4:
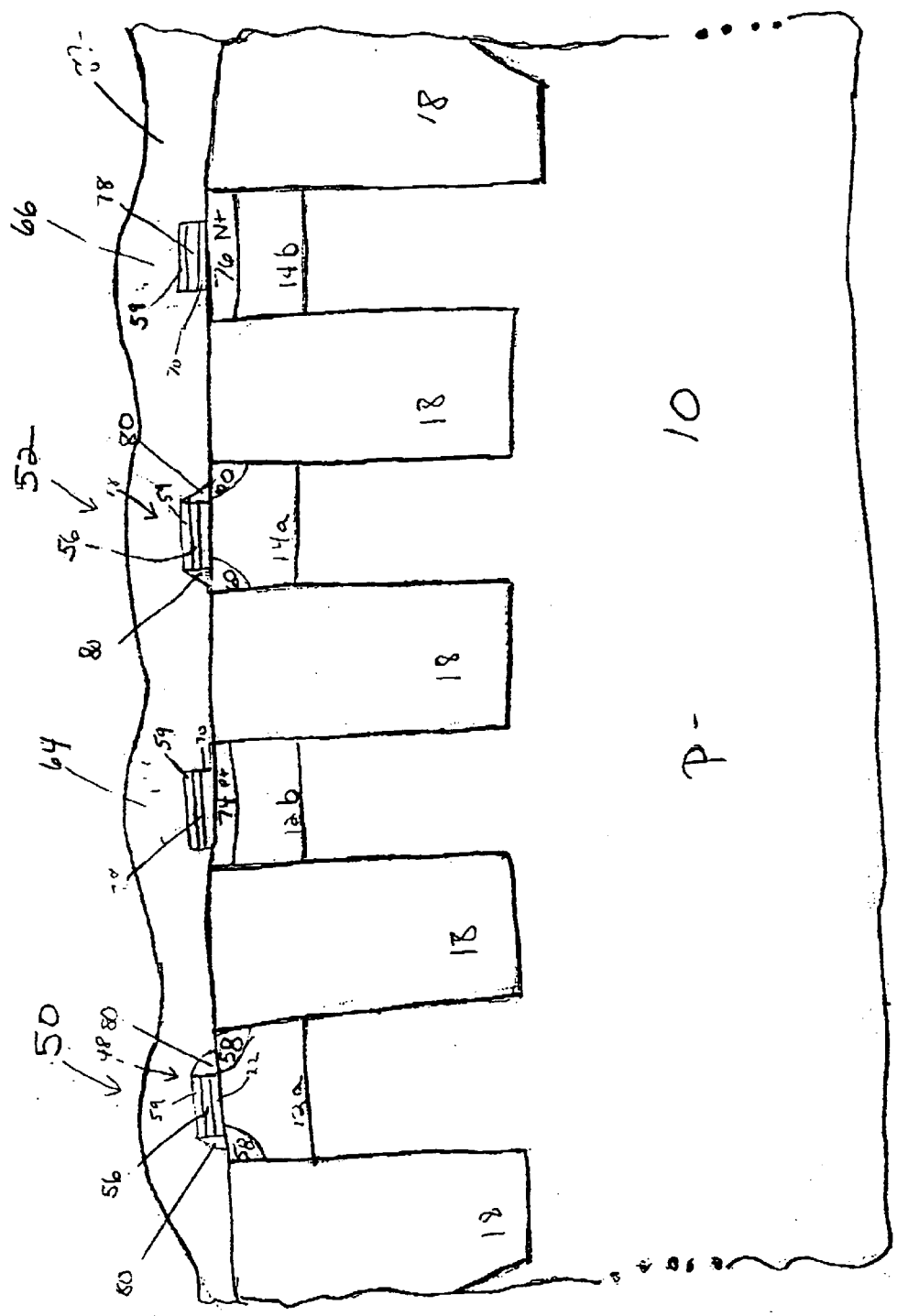
FIG. 4 illustrates a partially completed integrated circuit structure incorporating the invention.

FIG. 4 also illustrates a P-type MOS capacitor 64 formed over the region 12b and an N-type MOS capacitor 66 formed over the P-region 14b. The dielectric 70 of each capacitor is formed from the layer 22 to provide high k capacitors. Other features of the exemplary capacitors 64 and 66 may be in accord with conventional fabrication. For example, the silicon layer 10 is heavily doped P-type in the region 12b and heavily doped N-type in the region 14b. This may be accomplished by ion implantation, e.g., simultaneously with definition of source/drain regions 58 and 60 prior to formation of the layer 22, to provide a first P-type conductive plate 74 for the capacitor 64 and a first N-type conductive plate 76 for the capacitor 66.

Simultaneous formation of the first plates 74 and 76 with the CMOS source/drain regions 58 and 60 is conventional and may be accomplished by formation of a dummy gate prior to thermal growth of the dielectric layer 22. The same polysilicon material deposited for the gate conductor layer 56 is further patterned over the layer 22 to define a second conductive plate 78 for each of the capacitors 64 and 66.

As illustrated in FIG. 4 the gate structures 48 each include side wall oxide filaments 80 (typically $Si_3N_4$ over $SiO_2$). A silicon nitride dielectric layer 82, formed according to conventional fabrication steps, is deposited over the gate structures 48 and capacitors 64 and 66 to provide device isolation. Contacts (not illustrated) may be formed of W and WSi to provide connection between the various conductive regions 56, 58, 60, 74, 76 and overlying interconnect (also not illustrated). The conductive plates 78 also include silicide layers 59.

Alternate embodiments of the invention include provision of a species other than Hf and Zr alone or in combination to modify the dielectric properties of the layer 22. Suitable materials may include Ba, Ta, Sr, N and Ti, or combinations of foregoing. It is also contemplated that introduction of the species 27 may be accomplished prior to formation of the thermally grown silicon dioxide layer 22. For an oxide-silicon interface an implant or other species infusion can be performed before or during a thermal growth of silicon dioxide, possibly by deposition of the species 27 on a partially grown oxide layer followed by re-oxidation in order to limit diffusion of the species 27. It is also contemplated that a species 27 with appropriate thermal diffusion characteristics may be introduced during an epitaxial formation of the semiconductor layer 10.

Capacitors which differ from the illustrated embodiments may be formed with the invention. For example, a silicon dioxide layer may be formed over a polysilicon layer (by deposition or thermal oxidation of silicon) to provide a dielectric layer which is subsequently infused with a species such as Hf or Zr, e.g., by implantation.

The invention has been described with only a few illustrative embodiments while the principles disclosed herein provide a basis for practicing the invention in a variety of ways on a variety of semiconductor structures. Gate dielectric layers and capacitor dielectric layers formed in accord with the foregoing will provide relatively high dielectric constants for improved device performance. For the layer 22, infused with Hf or Zr by implantation, the dielectric constant of the 6 nm layer (relative to free space) is expected to be in the range of 15 to 25 but may extend beyond 30. Generally, insulator layers formed according to the invention will exhibit dielectric constants greater than five and greater than achievable with conventional materials, e.g., $Si_3N_4$ or $SiO_2$, used on semiconductor layers. Other constructions of the invention, although not expressly described herein, do not depart from the scope of the invention which is only to be limited by the claims which follow.

What is claimed is:

1. A method of forming an electronic circuit, comprising the steps of:

forming, on a semiconductor layer, an insulative layer, comprising two or more elements chemically bonded to one another, with first and second opposing surfaces and a first surface region of the insulative layer positioned along the first surface and along the semiconductor layer, with a second surface region along the second surface, and with a mid region formed between the first and second surface regions; and introducing an additional species, taken from the group consisting of Ba, Ta, Ti, Zr, HF and Sr, into the insulative layer in sufficient quantity to modify the net dielectric constant of the layer and with concentration of the additional species greater in the mid region than along the first surface; and forming a conductive layer on the insulative layer.

2. The method of claim 1 wherein the step of introducing an additional species is effected by ion implantation of an element.

3. The method of claim 1 wherein:

the step of introducing the additional species is accomplished by implantation of the species predominately into a region other than the first surface region.

4. The method of claim 1 wherein the additional species is introduced by implantation predominantly into the mid region of the layer.

5. The method of claim 1 further including the step of diffusing the species from the mid region toward the first and second surface regions.

6. A method of forming an electronic circuit, comprising the steps of:

forming, on a semiconductor layer, an insulative layer by thermal oxidation along a surface of the semiconductor layer, said insulative layer including first and second opposing surfaces with a first surface region of the insulative layer positioned along the first surface and along the semiconductor layer, with a second surface region along the second surface, and with a mid region formed between the first and second surface regions; and introducing an additional species, taken from the group consisting of Ba, Ta, Ti, Zr, HF and Sr, into the insulative layer in sufficient quantity to modify the net dielectric constant of the layer and with concentration of the additional species greater in the mid region than along the first surface.

* * * * *